(12) United States Patent
Seol et al.

(10) Patent No.: US 9,173,300 B2
(45) Date of Patent: Oct. 27, 2015

(54) METHOD OF MANUFACTURING PRINTED CIRCUIT BOARD

(75) Inventors: Jeong-Hoon Seol, Changwon (KR); Youn-Kwon Jung, Changwon (KR); Sang-Kun Kim, Changwon (KR)

(73) Assignee: HAESUNG DS CO., LTD, Changwon-si (KR)

( * ) Notice: Subject to any disclaimer, the term of this patent is extended or adjusted under 35 U.S.C. 154(b) by 131 days.

(21) Appl. No.: 13/603,959

(22) Filed: Sep. 5, 2012

(65) Prior Publication Data

US 2013/0313009 A1  Nov. 28, 2013

(30) Foreign Application Priority Data

May 22, 2012 (KR) .......................... 10-2012-0054452

(51) Int. Cl.
*H05K 3/36* (2006.01)
*H05K 3/00* (2006.01)
*H05K 3/42* (2006.01)

(52) U.S. Cl.
CPC .............. *H05K 3/0094* (2013.01); *H05K 3/427* (2013.01); *H05K 2201/0959* (2013.01)

(58) Field of Classification Search
CPC ...................... H01L 2924/1517; H05K 1/0298; H05K 3/46; B32B 2310/0843; B32B 2457/08
USPC ............ 29/830, 825, 829, 846, 847; 174/250, 174/256, 262
See application file for complete search history.

(56) References Cited

U.S. PATENT DOCUMENTS

| | | | |
|---|---|---|---|
| 6,881,293 B2 * | 4/2005 | Nakamura et al. | 156/307.1 |
| 7,765,686 B2 | 8/2010 | Murakami et al. | |
| 8,134,081 B2 * | 3/2012 | Sakurai et al. | 174/256 |

FOREIGN PATENT DOCUMENTS

| | | | | |
|---|---|---|---|---|
| JP | 11-340626 | * | 12/1999 | H05K 3/46 |
| JP | 11-340626 A | | 12/1999 | |
| JP | 2003-289183 A | | 10/2003 | |
| JP | 2006-303398 A | | 11/2006 | |
| KR | 10-2010-0042664 A | | 4/2010 | |

* cited by examiner

*Primary Examiner* — Thiem Phan
(74) *Attorney, Agent, or Firm* — Sughrue Mion, PLLC (57) ABSTRACT

A method of manufacturing a printed circuit board (PCB) and the PCB are provided. The method includes: filling a resin in a via-hole formed at a substrate from one surface side of the substrate; emitting light for a predetermined period of time to the resin filled in the via-hole from the other surface side of the substrate; and applying another resin on the other surface of the substrate.

8 Claims, 9 Drawing Sheets

METHOD OF MANUFACTURING PRINTED CIRCUIT BOARD

CROSS-REFERENCE TO RELATED PATENT APPLICATION

This application claims priority from Korean Patent Application No. 10-2012-0054452, filed on May 22, 2012, in the Korean Intellectual Property Office, the disclosure of which is incorporated herein in its entirety by reference.

BACKGROUND

1. Field

Apparatuses and methods consistent with exemplary embodiments relate to a printed circuit board (PCB), and more particularly, to a PCB and a method of manufacturing the same.

2. Description of the Related Art

In order to manufacture a semiconductor package, a substrate on which a semiconductor chip including electrical circuits is to be mounted is required. The substrate has a circuit pattern on one surface or both surfaces thereof to transmit an electrical signal from the semiconductor chip to an external device or to receive an electrical signal from an external device. In order to electrically connect the circuit patterns formed on both surfaces of the substrate, a plurality of via-holes are formed in the substrate and are plated. Empty spaces of the via-holes after the plating are filled with a resin.

The resin filled in the via-holes is cured. The resin is recessed while being cured. Once the resin filled in the via-holes is recessed, when the semiconductor chip is mounted on the substrate, an adhesive force between the semiconductor chip and the substrate is reduced. In order to prevent the resin filled in the via-holes from being recessed, a method of flattening the resin has been developed.

A method of flattening a resin filled in via-holes is disclosed in Japanese Patent Application Publication No. hei 11-340626 (hereinafter, referred to as a reference). The reference discloses a method of filling a resin in via-holes and applying ultraviolet light to an entire surface of a substrate. As such, once the ultraviolet light is applied to the entire surface of the substrate, the ultraviolet light may affect a circuit pattern formed on the substrate, thereby reducing the conductivity of the circuit pattern.

SUMMARY

One or more exemplary embodiments provide a PCB that flattens a resin filled in a via-hole and a method of manufacturing the PCB.

According to an aspect of an exemplary embodiment, there is provided a method of manufacturing a PCB, the method including: filling a resin in a via-hole formed at a substrate from one surface side of the substrate; emitting light for a predetermined period of time to the resin filled in the via-hole from the other surface side of the substrate; and applying another resin on the other surface of the substrate.

To emit the light, there may be provided a mask which is patterned such that the light is blocked from being emitted to the area where the via-hole is not formed and the light is applied to the via-hole. The mask may be disposed over the other surface of the substrate, and the light can be emitted to the mask.

The other resin may be applied on the other surface of the substrate two times.

The applying the other resin two times may include: applying resin on the other surface of the substrate a first time; curing the substrate a first time; applying resin on the other surface of the substrate a second time; and curing the substrate a second time.

According to an aspect of another exemplary embodiment, there is provided a method of manufacturing a PCB, the method including: filling a resin in a via-hole formed at a substrate from one surface side of the substrate; applying hot air for a predetermined period of time to the resin filled in the via-hole from the other surface side of the substrate; and applying another resin on the other surface of the substrate.

To apply the hot air, there may be provided a mask which is patterned such that the hot air is blocked from being applied to the area where the via-hole is not formed and the hot air is applied to the via-hole. The mask may be disposed over the other surface of the substrate, and the hot air is applied to the mask.

The other resin may be applied on the other surface two times.

The applying the other resin two times may include: applying resin on the other surface of the substrate a first time; curing the substrate a first time; applying resin on the other surface of the substrate a second time; and curing the substrate a second time.

After the patterning at least one surface of the substrate, the method may further include curing the substrate.

According to an aspect of another exemplary embodiment, there is provided a PCB manufactured by using one of the above methods.

BRIEF DESCRIPTION OF THE DRAWINGS

The above and other aspects will become more apparent by describing in detail exemplary embodiments thereof with reference to the attached drawings, in which.

DETAILED DESCRIPTION

The inventive concept will become more apparent to one of ordinary skill in the art by describing in detail exemplary embodiments thereof with reference to the accompanying drawings. In the drawings, the same reference numerals denote the same members.

Figure 1:
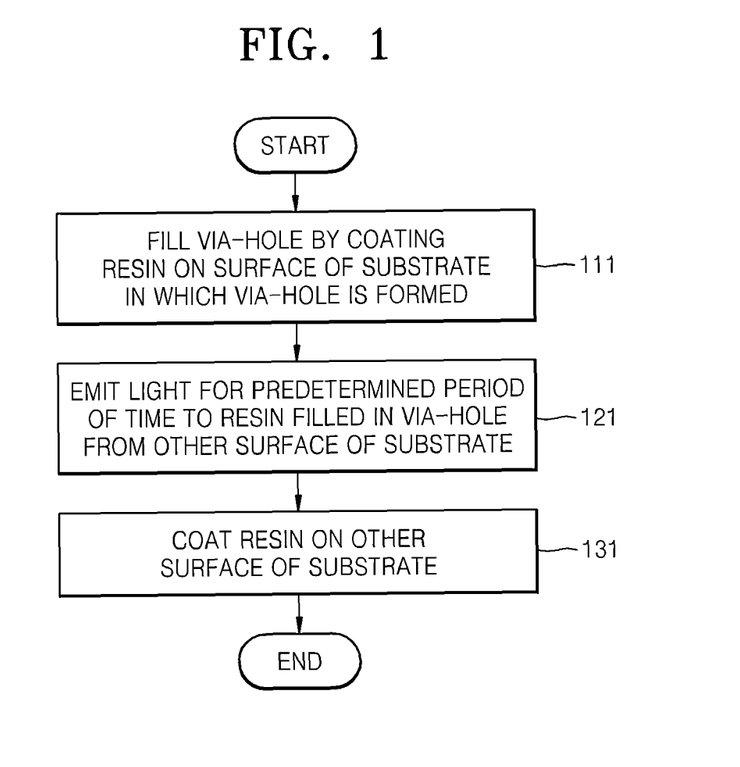
FIG. 1 is a flowchart illustrating a method of manufacturing a PCB according to an exemplary embodiment.

FIG. 1 is a flowchart illustrating a method of manufacturing a PCB 202, according to an exemplary embodiment. Referring to FIGS. 1-3B, the method includes operations 111 through 131.

In operation 111, a via-hole 221 formed at a substrate 210 is filled in by a resin 241. The via-hole 221 may be filled in by coating the resin 241.

A plurality of the via-holes 221 may be formed at the substrate 210. For convenience, the following description will be made on the assumption that one via-hole 221 is formed at the substrate 210.

In order to form the via-hole 221 at the substrate 210, the following four processes may be performed.

Figure 2A:
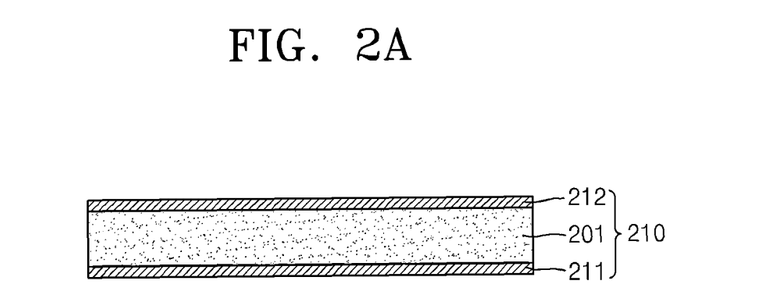
FIGS. 2A through 2D are cross-sectional views illustrating an operation of filling a via-hole in the method of FIG. 1 according to an exemplary embodiment.

In a first process, referring to FIG. 2A, the substrate 210, including a core substrate 201 and copper layers 211 and 212 formed on both surfaces of the core substrate 201, is prepared. The copper layers 211 and 212 may be replaced with metal layers each having conductivity. The core substrate 201 may be formed of one or a combination of insulating materials such as glass cloth, epoxy resin, polyimide, polymer, liquid crystal polymer, polytetrafluoroethylene (PTFE), poly(methyl methacrylate), and polycarbonate. The core substrate 201 has a flat shape. The core substrate 201 may be formed of a rigid material or a flexible material.

Adhesive layers (not shown) may be formed between the copper layer 211 and the core substrate 201 and/or between the copper layer 212 and the core substrate 201. Due to the adhesive layers, the copper layers 211 and 212 are attached to the core substrate 201. The copper layers 211 and 212 may be formed by stacking copper plates having the same size as that of the core substrate 201 on the adhesive layers or by depositing a copper material on the core substrate 201 by using vacuum deposition. Examples of the vacuum deposition may include sputtering, thermal evaporation, and e-beam deposition.

Since the copper layers 211 and 212 are used as media through which current flows when electroplating is performed, it is preferable, but not necessary, that the copper layers 211 and 212 are thin to reduce costs. To this end, thin copper layers may be stacked on both surfaces of the core substrate 201 or the copper layers 211 and 212 staked on the core substrate 201 may be polished to be thin.

Figure 2B:
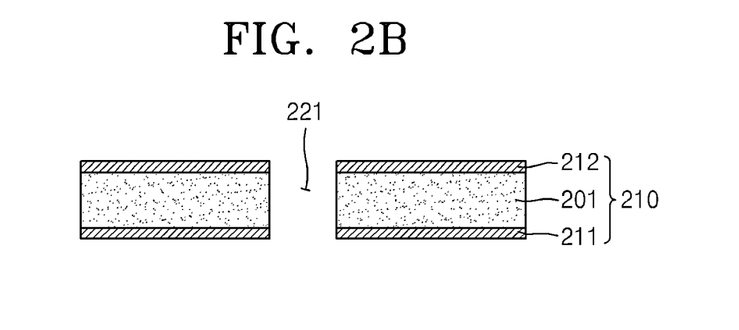

In a second process, referring to FIG. 2B, the via-hole 221, which vertically passes through the substrate 210, is formed. The vial-hole 221 may be formed by using a drill or by using a laser beam.

Figure 2C:
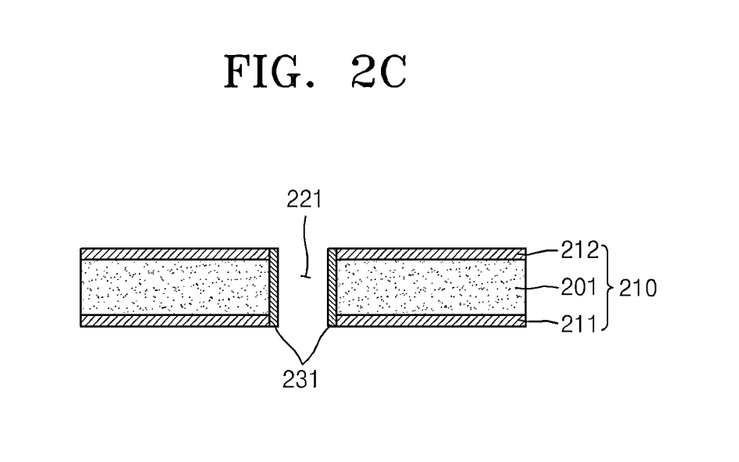

In a third process, referring to FIG. 2C, a first copper plating layer 231 is formed on an inner wall of the via-hole 221 by using electroless plating. The first copper plating layer 231 is formed to have a thickness less than that of each of the copper layers 211 and 212.

Figure 2D:
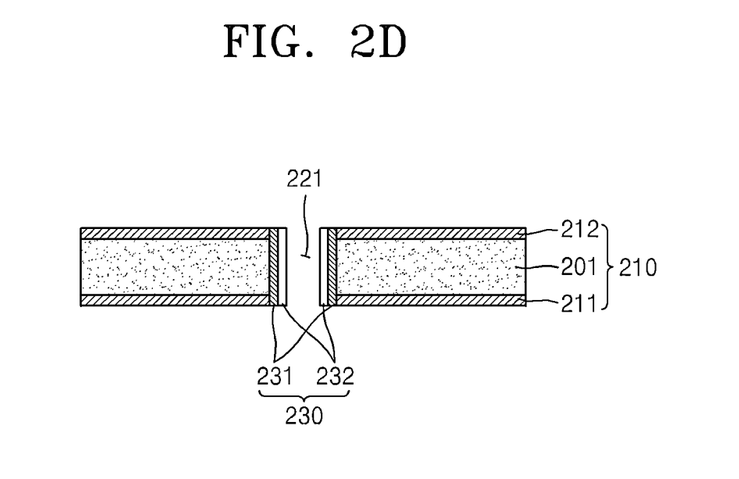

In a fourth process, referring to FIG. 2D, a second copper plating layer 232 is formed on a surface of the first copper plating layer 231 by using electroplating. Due to the first and second copper plating layers 231 and 232, the copper layer 211 formed on a bottom surface of the substrate 210 and the copper layer 212 formed on a top surface of the substrate 2140 are electrically connected to each other. That is, as a thickness of a copper plating layer formed on the inner wall of the via-hole 221 is increased due to the second copper plating layer 232, the copper layer 211 formed on the bottom surface of the substrate 210 and the copper layer 212 formed on the top surface of the substrate 210 are stably electrically connected to each other.

Next, a process of cleaning surfaces of the copper layers 211 and 212 may be performed. In order to clean the surfaces of the copper layers 211 and 212, wet cleaning or plasma processing may be performed. In order to perform the plasma processing, plasma is forced to collide with the surfaces of the copper layers 211 and 212. Accordingly, surface energy of the copper layers 211 and 212 is increased. Accordingly, when resins 241 and 251 are formed as photoresist layers (see FIG. 8) on the copper layer 212, an adhesive force between the photoresist layers and the copper layers 211 and 212 is increased, and, thus defects do not occur when patterns of the photoresist layers are formed.

Figure 3A:
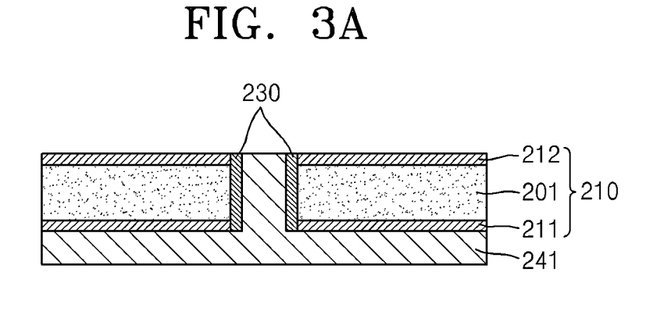
FIG. 3A is a cross-sectional view illustrating a state where a resin is coated on a surface of the substrate according to an exemplary embodiment.

Referring to FIG. 3A, the via-hole 221 (see FIG. 2D) is filled in by coating the resin 241 on a surface of the substrate 2140, for example, the bottom surface of the substrate 210. As the via-hole 221 is filled with the resin 241, voids are not formed at the via-hole 241. The resin 241 coated on the bottom surface of the substrate 210 may include a photo solder resist (the resin 241 is on the inner walls of the via-hole 241 and edge surfaces of the copper layers 211 and/or 212

Figure 3B:
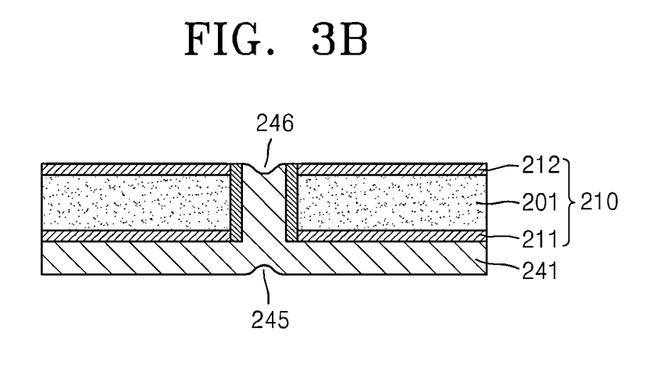
FIG. 3B is a cross-sectional view illustrating a state where the substrate of FIG. 3A is cured according to an exemplary embodiment.

After the resin 241 is coated on the bottom surface of the substrate 210, the substrate 210 is cured. Once the substrate 210 is cured, the resin 241 filled in the via-hole 210 is recessed to have a recessed portion 246, as shown in FIG. 3B.

In order to cure the substrate 210, infrared curing or oven curing may be performed. The infrared curing, which involves curing the substrate 210 by using infrared light, may be performed by preheating the substrate 210 for 1 minute, heating the substrate 210 at 60° C. for 3 minutes, heating the substrate 210 at 70° C. for 3 minutes, heating the substrate 210 at 80° C. for 3 minutes, and cooling the substrate 210 for 1 minute. When the infrared curing is performed, since curing occurs from an inner surface of the resin 241 contacting the substrate 210, an adhesive force of the resin 241 is increased. The oven curing cures the resin 241 coated on the substrate 210 by putting the substrate 210 into an oven (not shown) which is heated to a predetermined temperature, for example, 300 to 400° C., and heating the substrate 210 for a predetermined period of time. The temperature and the time are exemplary and are not limited, and may vary according to a type of the substrate 210 or a type of equipment.

In order to coat the resin 241 on a surface of the substrate 210, screen printing and roll coating may be used. If a resin to be coated on the substrate 210 is liquid, the screen printing or the roll coating may be used.

Figure 4:
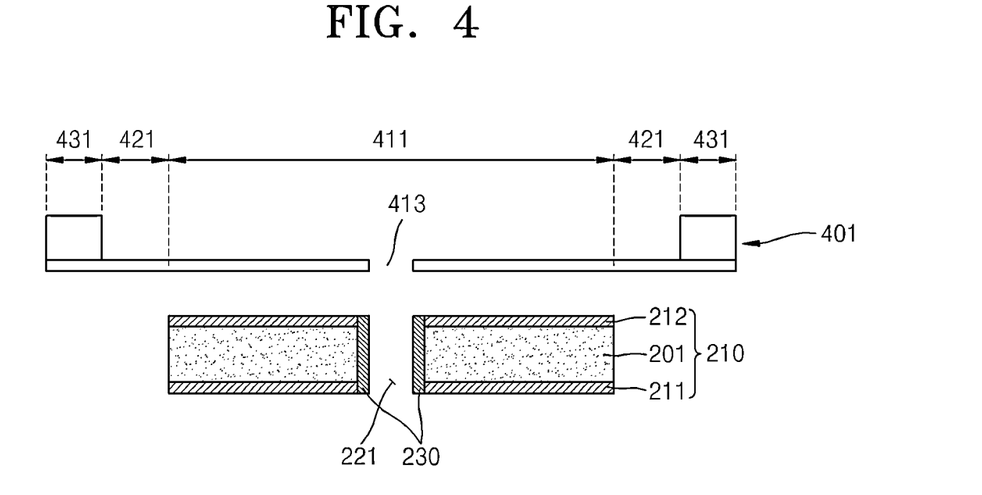
FIG. 4 is a cross-sectional view for explaining a method of coating a liquid resin on the substrate by using screen printing according to an exemplary embodiment.

In the screen printing, referring to FIG. 4, a screen mask 401 is disposed over the substrate 210, and a liquid resin is transferred from the screen mask 401 to the substrate 210. In this case, the liquid resin is cured by applying heat to the liquid resin. The screen mask 401 includes a screen mesh 411, a tension mesh 421, and a fixed frame 431. The screen mesh 411, which is a print effect area, has a plurality of holes 413 formed therein. The screen mesh 411 overlaps with the top surface of the substrate 210, and the liquid resin is transferred to the top surface of the substrate 210 through the screen mesh 411. The tension mesh 421 enables the screen mesh 411 to be maintained at a constant tensile force. The fixed frame 431 is used to fix the tension mesh 421.

Figure 5A:
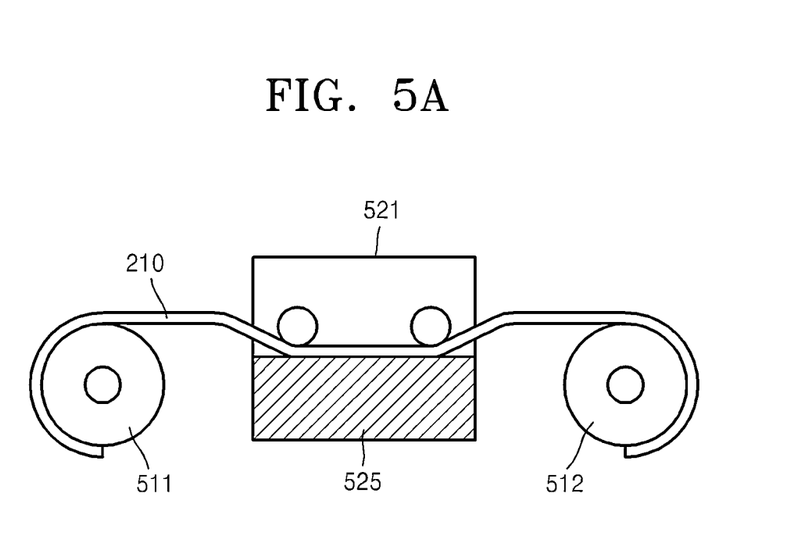
FIGS. 5A and 5B are cross-sectional views for explaining a method of coating a liquid resin on the substrate by using roll coating according to an exemplary embodiment.

In the roll coating, referring to FIG. 5A, when the substrate 210 wound on a supply roller 511 is unfastened, and then, wound on a reception roller 512, a liquid resin 525 may be coated on a surface of the substrate 210 by passing the substrate 210 through a container 521 in which the liquid resin 525 is contained. A thickness of the liquid resin 525 coated on the substrate 210 may be adjusted by adjusting a time and a speed at which the substrate 210 passes through the liquid resin 525. In order to cure the liquid resin 525 coated on the surface of the substrate 210, heat may be applied to the substrate 210.

Figure 5B:
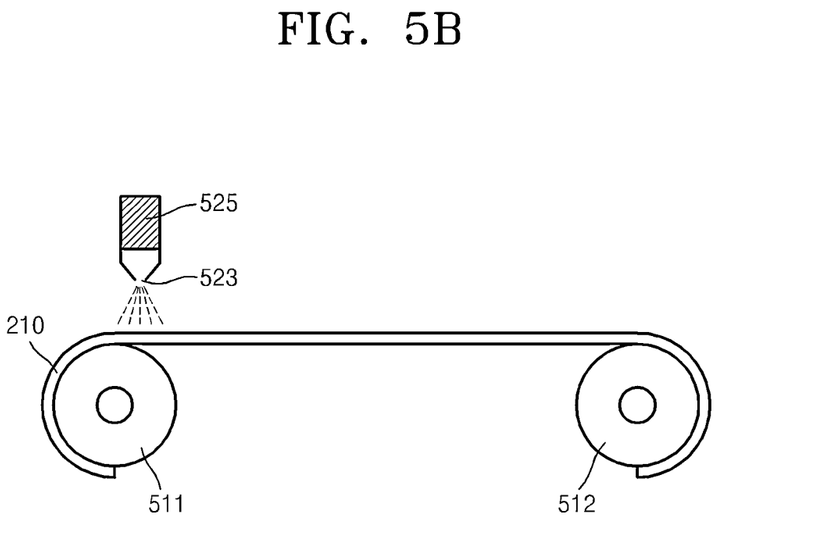

In another example of the roll coating, referring to FIG. 5B, when the substrate 210 wound on the supply roller 511 is unfastened, and then, wound on the reception roller 512, the liquid resin 525 may be coated on the surface of the substrate 210 by ejecting the liquid resin 525 to the substrate 210 through a nozzle 523. A thickness of the liquid resin 525 coated on the substrate 210 may be adjusted by adjusting an amount and a force of the liquid resin 525 ejected through the nozzle 523 or a speed at which the substrate 210 is fed. In order to cure the liquid resin 525 coated on the surface of the substrate 210, heat may be applied to the substrate 210.

In operation 121, light 613 and 615 (see FIG. 6), for example, ultraviolet light, is emitted for a predetermined period of time to the resin 241 filled in the via-hole 221 on the other surface of the substrate 210, for example, the top surface of the substrate 210. When the light 613 and 615 is emitted to the other surface of the substrate 210, the light 613 is blocked from being emitted to an area where the via-hole 221 is not formed and the light 615 is emitted to the via-hole 221. That is, a mask 601 that is patterned to block the light 613 from being emitted to the area where the via-hole 221 is not formed and to emit the light 615 to the via-hole 221 is disposed on the top surface of the substrate 210, and the light 613 and 615 is emitted to the mask 601. The light 613 and 615 may be ultraviolet light.

Figure 6:
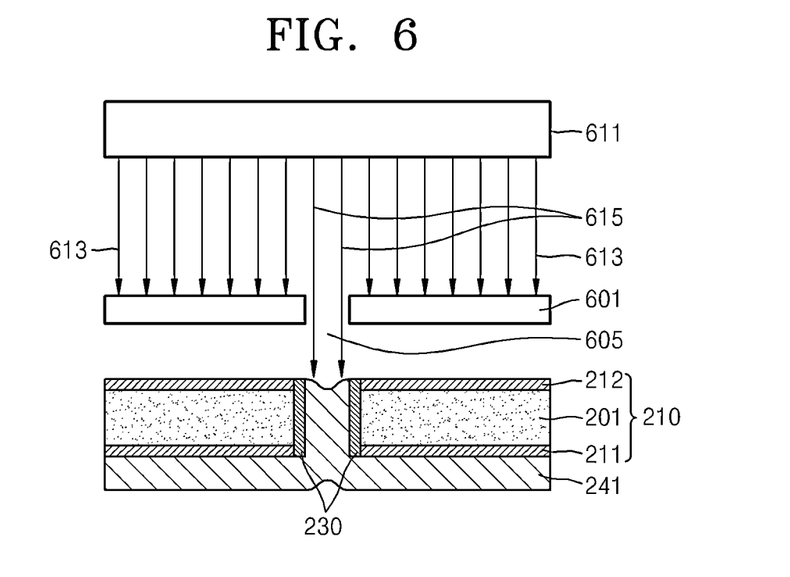
FIG. 6 is a cross-sectional view for explaining a method of applying light to the substrate according to an exemplary embodiment.

Referring to FIG. 6, the mask 601 is disposed on the substrate 210, and an ultraviolet light source 611 is disposed on the mask 601. The mask 601 is formed of a material capable of blocking ultraviolet light. A plurality of holes 605 are formed in the mask 601 in a pattern having the same positions and sizes as a plurality of the via-holes 221 (see FIG. 2B) formed at the substrate 210. Accordingly, the ultraviolet light 613 and 615 emitted by the ultraviolet light source 611 is emitted to only the plurality of via-holes 221 formed at the substrate 210 through the plurality of holes 605 formed at the mask 601. That is, the mask 601 is manufactured and disposed such that only the via-holes 221 of the substrate 210 are exposed to the ultraviolet light 613 and 615.

Figure 7:
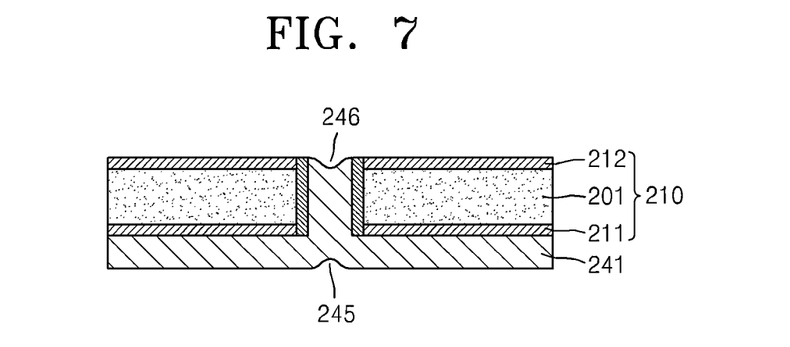
FIG. 7 is a cross-sectional view illustrating a result obtained by applying light to the substrate by using the method of FIG. 6 exemplary embodiments.

The resin 241 filled in each of the via-holes 221 is recessed during the curing. In this state, when the ultraviolet light 615 is emitted to the resin 241 filled in the via-hole 221, the resin 241 is optically cured and is prevented from being recessed during the curing (see FIG. 7).

A speed at which the resin 241 is optically cured varies according to a distance between the mask 601 and the substrate 210, a time during when the ultraviolet light 615 is emitted to the resin 241 filled in the via-hole 221, and a force of the ultraviolet light 615. In this case, it is necessary to set ultraviolet exposure conditions under which the resin 241 filled in the via-hole 221 is sufficiently cured and is prevented from being recessed.

A process of disposing the mask 601 over the substrate 210 and exposing the resin 241 filled in the via-hole 221 to the ultraviolet light 615 is simple as described above, and the resin 241 exposed to the ultraviolet light 615 is cured in a short time. That is, a process of flattening the resin 241 filled in the via-hole 221 is simple and takes a short time.

Figure 8:
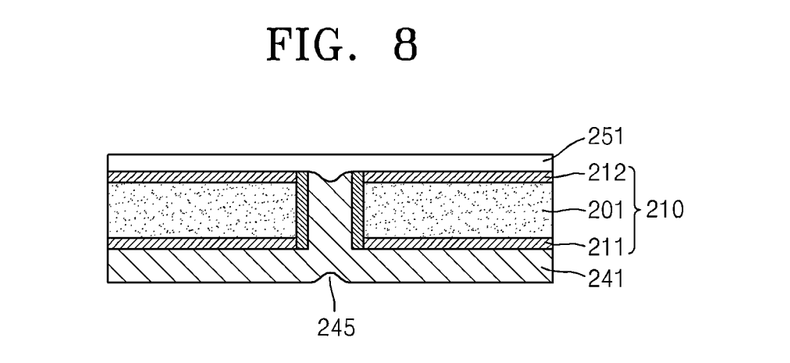
FIG. 8 is a cross-sectional view illustrating a state where a resin is coated on the other surface of the substrate according to an exemplary embodiment.

In operation 131, referring to FIG. 8, the resin 251 is coated on the top surface of the substrate 210. The resin 251 may include a photo solder resist. Due to the resin 251 coated on the top surface of the substrate 210, the recessed portion 246 (see FIG. 7) of the resin 251 filled in the via-hole 221 is filled up. Accordingly, as shown in FIG. 8, the resin 251 coated on the top surface of the substrate 210 is flattened.

The resin 251 may be coated on the top surface of the substrate 210 only one time or two times. When the resin 251 is coated two times, the flatness of the resin 251 coated on the top surface of the substrate 210 is improved.

In order to coat the resin 251 on the top surface of the substrate 210 two times, the following four processes may be performed.

Figure 9A:
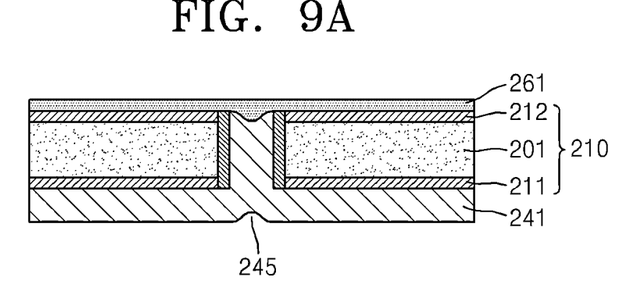
FIGS. 9A through 9D are cross-sectional views for explaining a method of coating a resin on the other surface of the substrate two times according to an exemplary embodiment.

In a first process, referring to FIG. 9A, a resin 261 is coated on the top surface of the substrate 210. Since the resin 261 is coated on the substrate 210, the recessed portion 246 (see FIG. 7) of the resin 241 is filled up. In order to coat the resin 261 on the top surface of the substrate 210, screen printing or roll coating may be used. The screen printing or the roll coating may be performed in the same manner as that described in operation 111.

Figure 9B:
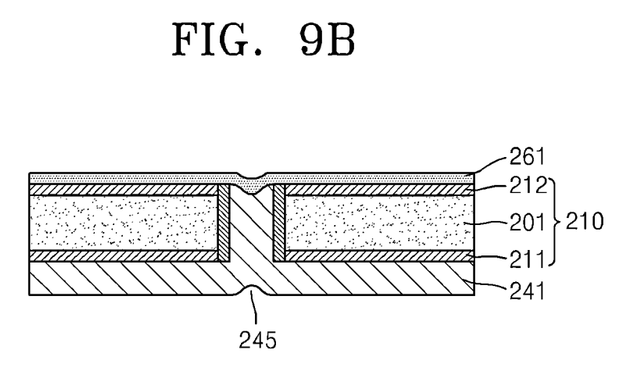

In a second process, referring to FIG. 9B, the substrate 210 is cured. When the substrate 210 is cured, the resin 261 coated on the top surface of the substrate 210 is cured. As the resin 261 is cured, a volume of the resin 261 filled in the via-hole 221 is reduced and recessed to have a recessed portion. In this case, a depth of the recessed portion is less than a depth of the recessed portion 246 in operation 111. In order to cure the substrate 210, infrared curing or oven curing may be performed. The infrared curing or the oven curing may be performed in the same manner as that described in operation 111.

Figure 9C:
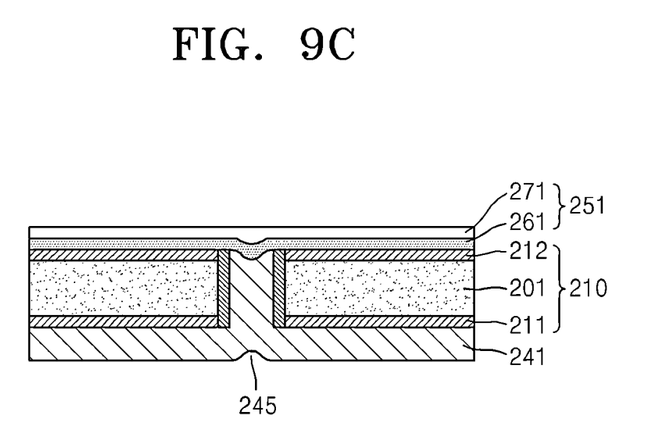

In a third process, referring to FIG. 9C, a resin 271 is coated on the top surface of the substrate 210. That is, the resin 271 is coated on the resin 261 coated on the substrate 210. Since the resin 271 is coated on the substrate 210, the recessed portion of the resin 261 filled in the via-hole 221 on the top surface of the substrate 210 is filled up. In order to coat the resin 271, screen printing or roll coating may be used. The screen printing or the roll coating may be performed in the same manner as that described in operation 111.

Figure 9D:
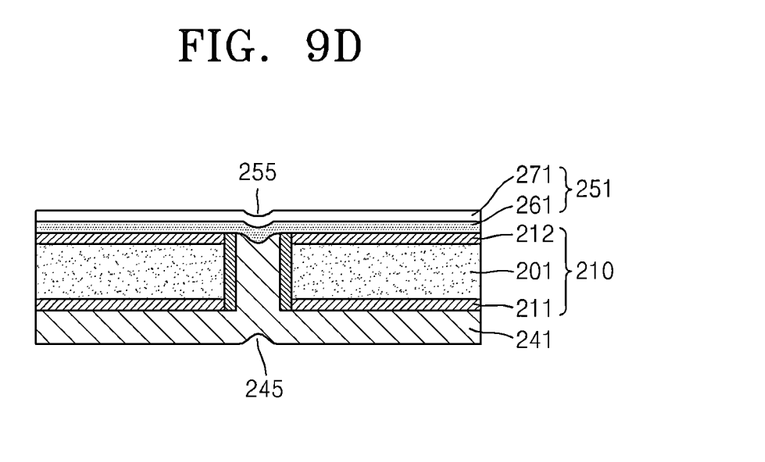

In a fourth process, referring to FIG. 9D, the substrate 210 on which the resin 271 is coated is cured again. When the substrate 210 is cured, the resin 271 coated on the top surface of the substrate 210 is cured. As the resin 271 is cured, a volume of the resin 271 coated on the via-hole 221 is reduced and recessed to have a recessed portion. In this case, a depth of the recessed portion is less than a depth of the recessed portion in the second process. In order to pre-cure the substrate 210, infrared curing or oven curing may be performed. The infrared curing or the oven curing may be performed in the same manner as that described in operation 111.

As described above, since the resin 251 is coated two times on the top surface of the substrate 210, the resin 251 coated on the via-hole 221 on the top surface of the substrate 210 is flattened.

Figure 10:
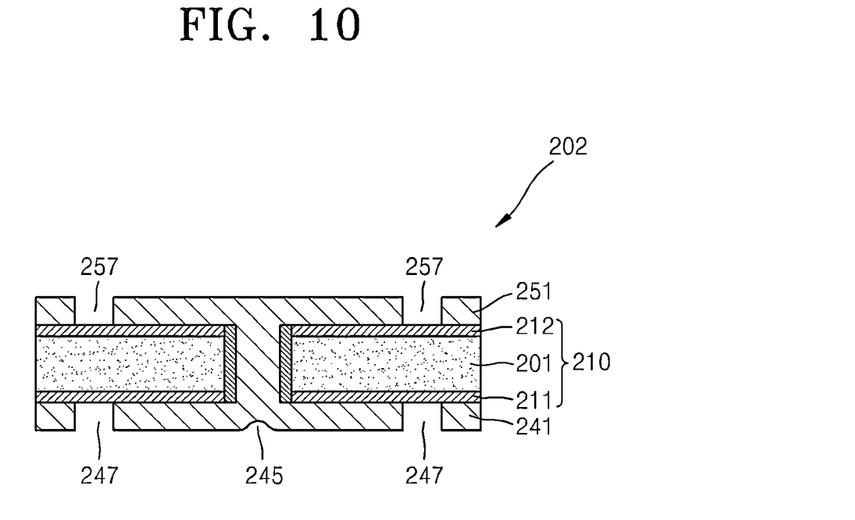
FIG. 10 is a cross-sectional view illustrating the PCB manufactured by using the method according to an exemplary embodiment.

Referring to FIG. 10, the resin 251 is coated on the top surface of the substrate 210 and both surfaces of the substrate 210 are patterned, thereby completing manufacture of the PCB 202. In order to pattern the both surfaces of the substrate 210, a photoresist may be coated on the both surfaces of the substrate 210 and then masking, exposure, development, and etching may be performed. Since the both surfaces of the substrate 210 may be patterned by using a general method, a detailed explanation of the general method is not given. According to another exemplary embodiment, only one surface may be patterned to complete manufacture of the PCB 202

After the both surfaces of the substrate 210 are patterned, the PCB 202 may be cured again. When the PCB 202 is cured at this time, the resins 241 and 251 coated on the PCB 202 are completely cured. In this case, the resin 241 filled in the via-hole 221 on a surface, that is, the bottom surface, of the PCB 202 is cured and is recessed to a predetermined depth. A semiconductor chip needed to manufacture a semiconductor package is attached to the other surface, that is, the top surface, of the PCB 202. Thus, even when the resin 241 filled in the via-hole 221 on the surface of the PCB 202 is recessed, the semiconductor package is not affected. In order to cure the PCB 202 after the substrate 210 is patterned, infrared curing or oven curing may be used. The infrared curing or the oven curing may be performed in the same manner as that described in operation 111.

Figure 11:
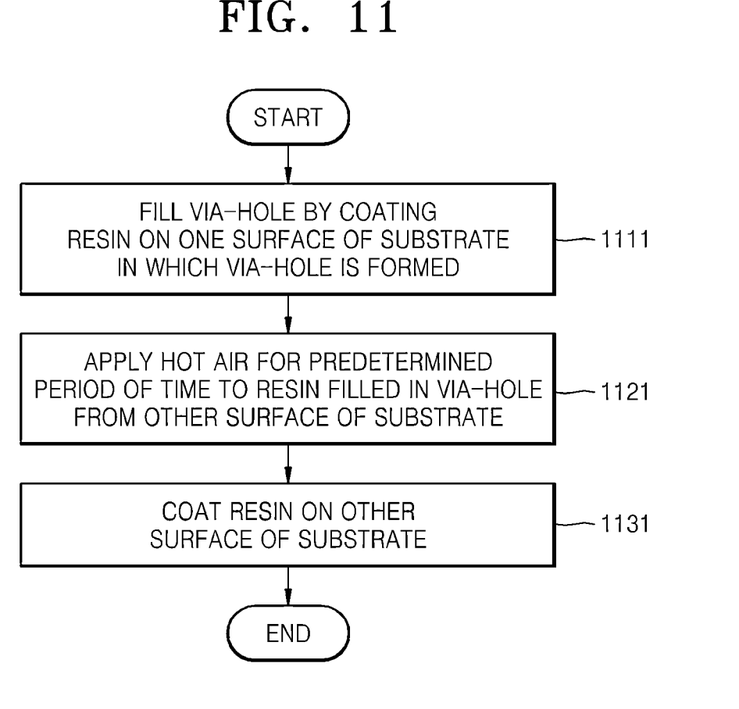
FIG. 11 is a flowchart illustrating a method of manufacturing the PCB according to another exemplary embodiment.

FIG. 11 is a flowchart illustrating a method of manufacturing the PCB 202, according to another embodiment. Referring to FIG. 11, the method includes operations 1111 through 1131. Operations 1111 and 1131 are the same as operations 111 and 131, and thus, only operation 1121 will be explained to avoid a repeated explanation.

Figure 12:
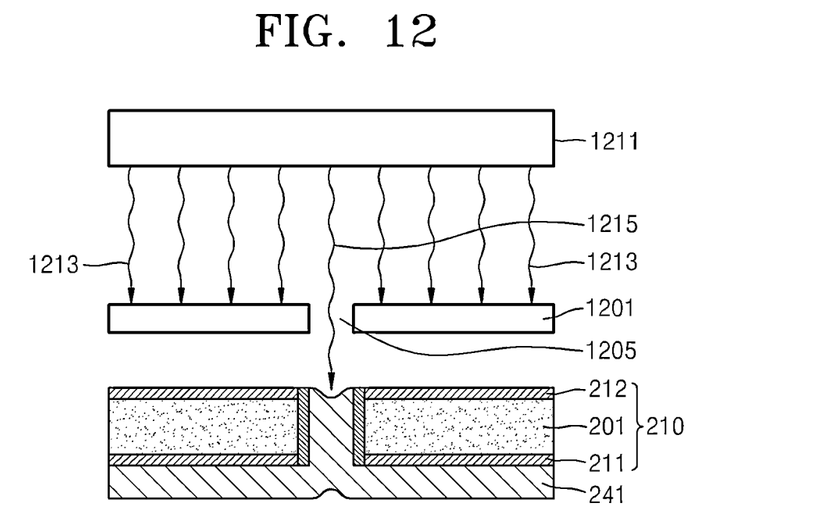
FIG. 12 is a cross-sectional view for explaining a method of applying hot air to a substrate according to an exemplary embodiment.

In operation 1121, hot air is applied for a predetermined period of time to the resin 251 filled in the via-hole 221 on the top surface of the substrate 210 (see FIG. 12). When the hot air is applied to the top surface of the substrate 210, the hot air is blocked from being applied to an area where the via-hole 221 is not formed and the hot air is applied to the via-hole 221. A mask 1201, which is patterned such that the hot air is blocked from being applied to the area where the via-hole 221 is not formed and the hot air is applied to the via-hole 221, is disposed over the top surface of the substrate 210 (see FIG. 12) and the hot air is applied to the mask 1201.

FIG. 12 is a cross-sectional view for explaining a method of applying hot air to the substrate 210. Referring to FIG. 12, the mask 1201 is disposed on the substrate 210 and a heater 1211 is disposed over the mask 1201. The mask 1201 is formed of a material capable of blocking hot air 1213. A plurality of holes 1205 are formed at the mask 1201 in a pattern having the same positions and sizes as a plurality of the via-holes 221 formed at the substrate 210. Accordingly, hot air 1213 and 1215 emitted from the heater 1211 is applied to only the plurality of via-holes 221 formed at the substrate 210 through the plurality of holes 1205 formed in the mask 1201. That is, the mask 1201 is manufactured and disposed such that only the via-holes 221 of the substrate 210 are exposed to the hot air 1213 and 1215.

The resin 241 is filled in each of the via-holes 221 of the substrate 210. As the hot air 1215 is applied to the via-hole 221, the resin 241 filled in the via-hole 221 is cured and loses its volume. That is, a central portion of the via-hole 221 is maximally recessed as shown in FIG. 12.

A speed at which the resin 241 filled in the via-hole 221 is cured varies according to a distance between the mask 1201 and the substrate 1201, a time during when the hot air 1215 is applied to the via-hole 221, and a force of the hot air 1215. In this case, it is necessary to set conditions under which the resin 241 filled in the via-hole 221 is sufficiently cured and maximally recessed.

Once the resin 241 filled in the via-hole 221 is maximally recessed, the resin 251 filled in the via-hole 221 on the top surface of the substrate 210 may be flattened.

A process of disposing the mask 1201 over the substrate 210 and exposing the resin 241 filled in the via-hole 221 to the hot air 1215 is simple as described above and the resin 241 exposed to the hot air 1215 is cured in a short time. That is, a process of flattening the resin 241 filled in the via-hole 221 is simple and takes a short time.

After operation 1131 in which the resin 251 is coated on the top surface of the substrate 210, both surfaces of the substrate 210 may be patterned as shown in FIG. 10. In order to pattern the both surfaces of the substrate 210, a photoresist may be coated on the both surfaces of the substrate 210 and then masking, exposure, development, and etching may be performed. Since the both surfaces of the substrate 210 may be patterned by using a general method, a detailed explanation of the general method is not given.

After the both surfaces of the substrate 210 are patterned, the substrate 210 may be cured. When the substrate 210 is cured at this time, the resins 241 and 251 coated on the substrate 210 are completely cured. In this case, the resins 241 filled in the via-hole 221 on the bottom surface, of the substrate 210 is cured and recessed to a predetermined depth. Since a semiconductor chip needed to manufacture a semiconductor package is attached to the top surface of the substrate 210, even when the resin 241 filled in the via-hole 221 on the bottom surface of the substrate 210 is recessed, the semiconductor package is not affected. In order to cure the substrate 210 at this time, infrared curing or oven curing may be used. The infrared curing or the oven curing may be performed in the same manner as that described in operation 111.

Figure 13A:
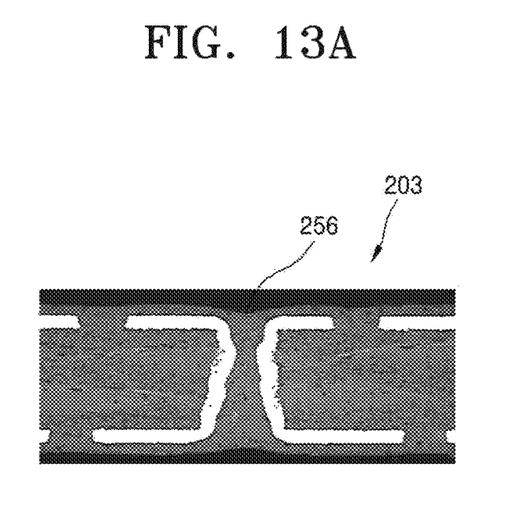
FIG. 13A is a cross-sectional view illustrating a substrate when a resin filled in a via-hole is flattened in a conventional method.
Figure 13B:
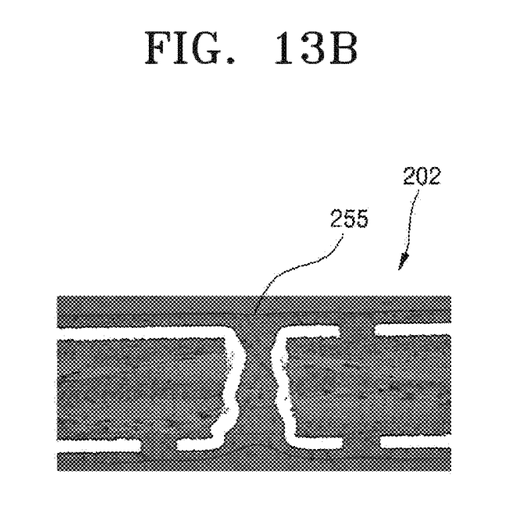
FIG. 13B is a cross-sectional view illustrating a substrate when a resin filled in a via-hole is flattened in a method according to exemplary embodiment.

FIGS. 13A and 13B are cross-sectional views illustrating a PCB 203 and 202 in which a resin 256 is flattened in a conventional method and the PCB 202 in which a resin 255 is flattened in a method according to the above exemplary embodiments. Referring to FIGS. 13A and 13B, the resin 256 filled in a via-hole on a top surface of the PCB 203 is not completely flattened whereas the resin 255 filled in a via-hole on a top surface of the PCB 202 is completely flattened.

According to the exemplary embodiments, when a PCB is manufactured, a resin is filled in a substrate in which a via-hole is formed and ultraviolet light or hot air is applied to only the resin. Accordingly, the resin filled in the substrate is maximally recessed.

As described above, when the resin filled in the substrate is maximally recessed, the resin is coated on the substrate and the resin filled in the via-hole is flattened.

A process of flattening the resin is simple and takes a short time. Also, since the PCB is manufactured when the resin coated on the via-hole is flattened, a defective rate perceived by customers may be reduced. Also, overall costs for manufacturing the PCB may be reduced.

While the inventive concept has been particularly shown and described with reference to exemplary embodiments thereof using specific terms, the embodiments and terms have been used to explain the inventive concept and should not be construed as limiting the scope of the inventive concept defined by the claims. Accordingly, it will be understood by one of ordinary skill in the art that various changes in form and details may be made therein without departing from the spirit and scope of the inventive concept as defined by the following claims.

What is claimed is:

1. A method of manufacturing a printed circuit board (PCB), the method comprising:
   filling first resin in a via-hole formed at a substrate from a first surface side of the substrate;
   curing the substrate to provide a first recessed portion on the first resin filled in the via-hole;
   emitting light during a predetermined period of time to the first resin filled in the via-hole from a second surface side opposite from the first surface side of the substrate; and
   applying a first layer of second resin on the second surface side of the substrate and the first recessed portion,
   wherein the applying the first layer of the second resin on the second surface side of the substrate comprises applying the first layer of the second resin two times, the applying the first of the second resin two times comprising:
   applying the first layer of the second resin on the second surface side of the substrate a first time;
   curing the substrate a first time;
   applying the first layer of the second resin on the second surface side of the substrate a second time; and
   curing the substrate a second time.

2. The method of claim 1, wherein when the light is applied to the first resin from the second surface side of the substrate, the light is blocked from being emitted to an area where the via-hole is not formed and the light is emitted to the via-hole.

3. The method of claim 2, wherein a mask, which is patterned such that the light is blocked from being emitted to the area where the via-hole is not formed and the light is applied to the via-hole, is disposed over the second surface side of the substrate and the light is emitted to the mask.

4. The method of claim 1, further comprising, after applying the first layer of the second resin on the second surface side of the substrate, patterning at least one surface of the substrate.

5. The method of claim 4, further comprising, after the patterning of the at least one surface of the substrate, curing the substrate.

6. The method of claim 1, wherein the filling the first resin in the via-hole comprises:
   filling the first resin in the via-hole such that the first resin filled in the via-hole and the substrate form a coplanar surface; and
   providing a second layer of the first resin on the first surface side of the substrate.

7. The method of claim 6, wherein the curing the substrate causes the second layer of the first resin to have a second recessed portion.

8. The method of claim 1, wherein the applying the first layer of the second resin comprises applying the first layer of the second resin after the curing the substrate.

* * * * *